(12) United States Patent
Shepard

(10) Patent No.: US 7,682,981 B2
(45) Date of Patent: Mar. 23, 2010

(54) TOPOGRAPHY TRANSFER METHOD WITH ASPECT RATIO SCALING

(75) Inventor: Daniel Robert Shepard, North Hampton, NH (US)

(73) Assignee: Contour Semiconductor, Inc., No. Billerica, MA (US)

( * ) Notice: Subject to any disclaimer, the term of this patent is extended or adjusted under 35 U.S.C. 154(b) by 103 days.

(21) Appl. No.: 11/341,953

(22) Filed: Jan. 27, 2006

(65) Prior Publication Data

US 2006/0166508 A1 Jul. 27, 2006

Related U.S. Application Data

(60) Provisional application No. 60/647,540, filed on Jan. 27, 2005.

(51) Int. Cl.
*H01L 21/302* (2006.01)
(52) U.S. Cl. .................... 438/713; 216/44; 216/54; 257/E21.233; 257/E21.235
(58) Field of Classification Search ............ 438/531, 438/713, 735; 257/E21.233, E21.235
See application file for complete search history.

(56) References Cited

U.S. PATENT DOCUMENTS

| | | | | |
|---|---|---|---|---|
| 6,165,911 | A * | 12/2000 | Calveley | 438/754 |
| 6,828,068 | B2 * | 12/2004 | Progler et al. | 430/5 |
| 6,860,956 | B2 * | 3/2005 | Bao et al. | 156/232 |
| 7,018,575 | B2 * | 3/2006 | Brewer et al. | 264/108 |
| 7,052,926 | B2 * | 5/2006 | Huff | 438/48 |
| 2002/0182241 | A1 * | 12/2002 | Borenstein et al. | 424/422 |
| 2003/0112576 | A1 * | 6/2003 | Brewer et al. | 361/119 |
| 2003/0205657 | A1 * | 11/2003 | Voisin | 249/187.1 |
| 2005/0037608 | A1 * | 2/2005 | Andricacos et al. | 438/637 |
| 2005/0067286 | A1 * | 3/2005 | Ahn et al. | 205/70 |
| 2007/0037307 | A1 * | 2/2007 | Donofrio | 438/42 |

OTHER PUBLICATIONS

C. M. Waits, R. Ghodssi, and M. Dubey, Department of Electrical and Computer Engineering, "Gray-Scale Lithography for MEMS Applications", MEMS Alliance Poster Session Fall 200.

* cited by examiner

*Primary Examiner*—Matthew Smith
*Assistant Examiner*—Shaka Scarlett
(74) *Attorney, Agent, or Firm*—Goodwin Procter LLP

(57) ABSTRACT

The present invention is a method of applying a topographical surface to a part such as a substrate without the need for low temperature softening of that part while retaining high aspect ratios and densely packed features in that topography. A substrate, selected for its ability to be processed at a given desired temperature, has a layer of material applied to its surface. This layer is selected, among other reasons, for its ability to be molded. Typically, it is expected that the substrate will be able to withstand the higher temperatures of semiconductor post-processing whereas the applied layer will be moldable at low temperatures. This combination enables low cost embossing of a topography into this surface layer. The present invention comprises means to transfer this topography from the low temperature material into the higher temperature substrate. In addition, the present invention comprises a means to scale the aspect ratio of the features of that topography when it is transferred into the substrate material. Since the sidewall angle must be opened enough to permit demolding of the master form from the substrate after molding, some very vertical sidewall angles may not be possible during a molding-demolding operation. The present invention is a means to achieve steeper sidewall angles on features in a substrate where those features are applied by way of a molding process.

7 Claims, 4 Drawing Sheets

US 7,682,981 B2

TOPOGRAPHY TRANSFER METHOD WITH ASPECT RATIO SCALING

CROSS REFERENCE TO RELATED APPLICATIONS

This application claims the benefits of U.S. Provisional Application No. 60/647,540, filed on Jan. 27, 2005, and that document in its entirety is hereby incorporated herein by reference.

FIELD OF THE INVENTION

The present invention relates to the manufacture and processing of semiconductor wafers, and more particularly to methods for applying a topography to the surface of a wafer.

REFERENCE TO A SEQUENCE LISTING, A TABLE, OR A COMPUTER PROGRAM LISTING COMPACT DISK APPENDIX

Not Applicable.

REFERENCE REGARDING FEDERAL SPONSORSHIP

Not Applicable.

STATEMENT REGARDING FEDERALLY SPONSORED RESEARCH OR DEVELOPMENT

Not Applicable.

SUMMARY OF THE INVENTION

Semiconductor manufacturing is typically performed on the flat surface of a substrate such as a crystalline silicon wafer, quartz wafer, glass or the like. New processing techniques rely upon surface topographies that are patterned into the surface of the wafer. Economic topography application techniques include stamping, embossing, and molding, to name a few. Many of these techniques require use of a material that will soften at temperatures lower than the preferred temperatures for processing steps; that is to say that some materials such as polycarbonate plastics are molded at temperatures below 200 degrees centigrade whereas subsequent processing such as annealing might need to be performed at temperatures above 400 degrees centigrade.

Furthermore, in a molding process, the angle of the sidewalls of the molded features must sloped (as opposed to vertical) to enable demolding the molded surface from the master form. To facilitate this operation, features might have to be placed farther apart than desired or be molded with smaller aspect ratios than desired.

The present invention is a method of applying a topographical surface to a part such as a substrate without the need for low temperature softening of that part while retaining high aspect ratios and densely packed features in that topography.

DESCRIPTION OF THE PREFERRED EMBODIMENT

The present invention is a method of applying a topographical surface to a part such as a substrate without the need for low temperature softening of that part while retaining high aspect ratios and densely packed features in that topography. A substrate, selected for its ability to be processed at a given desired temperature, has a layer of material applied to its surface. This layer is selected, among other reasons, for its ability to be molded. For example, as is known to those skilled in the art and particularly to those skilled in the art of imprint lithography, PMMA (a material used as a photoresist) can be embossed with very fine surface features. Typically, it is expected that the substrate will be able to withstand the higher temperatures of semiconductor post-processing whereas the applied layer will be moldable at low temperatures. This combination enables low cost embossing of a topography into this surface layer. The present invention comprises means to transfer this topography from the low temperature material into the higher temperature substrate. In addition, the present invention comprises a means to scale the aspect ratio of the features of that topography when it is transferred into the substrate material. Since the sidewall angle must be opened enough to permit demolding of the master form from the substrate after molding, some very vertical sidewall angles may not be possible during a molding-demolding operation. The present invention is a means to achieve steeper sidewall angles on features in a substrate where those features are applied by way of a molding process.

A multiple level lithography transfer method has been demonstrated using a technique called gray-scale lithography (see: C. M. Waits, R. Ghodssi, and M. Dubey, Department of Electrical and Computer Engineering, "Gray-Scale Lithography for MEMS Applications", MEMS Alliance Poster Session-Fall 2001). In this technique, photoresist is exposed in such a way that different areas will develop having different resulting thicknesses such that an underlying silicon surface can be dry etched to transfer the 3-D photoresist pattern into the silicon. The present invention likewise will enable a 3-D imprinted pattern to be transferred into the silicon (or other substrate).

Figure 1:
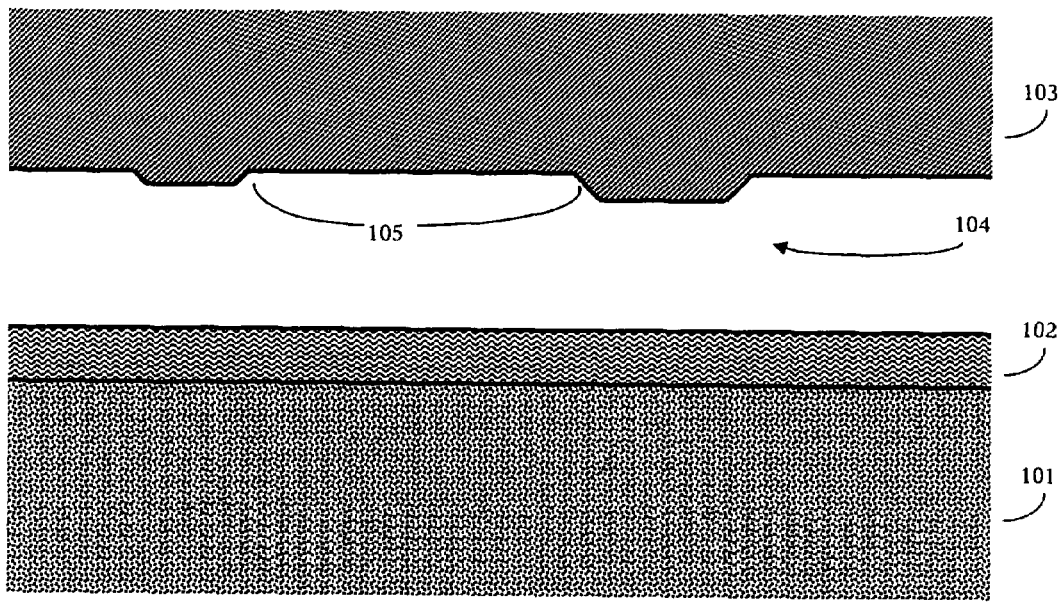
FIG. 1 illustrates a cross section of a surface into which a topographic pattern is to be applied along with the master form having a reverse relief pattern of that topographic pattern.

As shown in cross section in FIG. 1, a substrate, 101, has a layer of material, 102, upon its surface. This layer can be applied through many possible techniques of which a few of the possibilities include, spinning on the film, sputtering, chemical application, or spraying, to name a few. A master form, 103, having a surface topography, 104, that is the complement of the desired topography to be molded into layer, 102. This master form topography is constructed such that the sidewalls, 105, of the features of the topography will enable subsequent demolding. This construction is understood by those skilled in the art of plastics molding, including those skilled in the art of molding CD-ROM's and DVD's.

Figure 2:
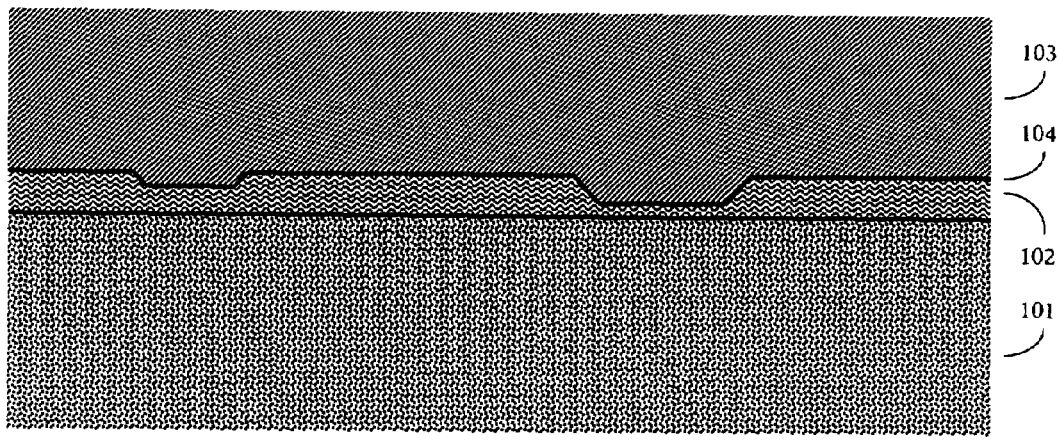
FIG. 2 illustrates a cross section of a surface having a moldable layer thereon and showing the forming of a topographic pattern into said moldable layer by a master form having a reverse relief pattern of that topographic pattern.
Figure 3:
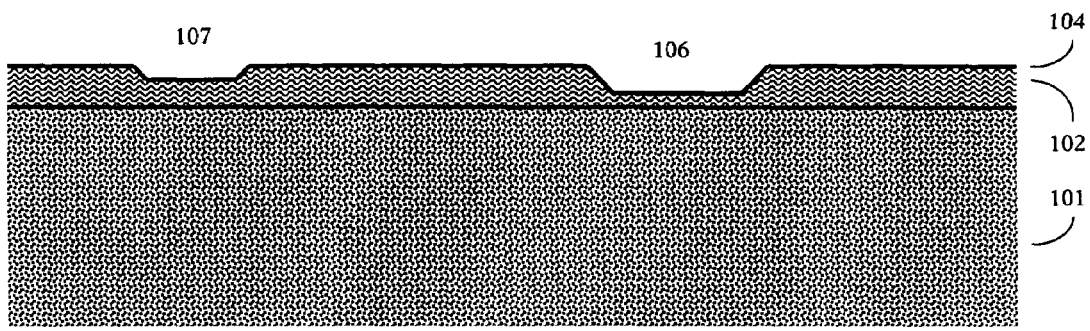
FIG. 3 illustrates a cross section of a surface having a moldable layer thereon and showing the formed topographic pattern in said moldable layer by a master form having a reverse relief pattern of that topographic pattern following demolding.

FIG. 2 shows the molding of the master form topography into moldable layer, 102, and FIG. 3 shows the topography molded into the moldable layer, 102, following demolding. These molding and demolding steps are well understood by those skilled in the art of plastics molding, including those skilled in the art of molding CD-ROM's and DVD's. The topography can consist of a single depth feature or can consist of multiple depths including both deeper features, 106, and shallower features, 107.

Figure 4:
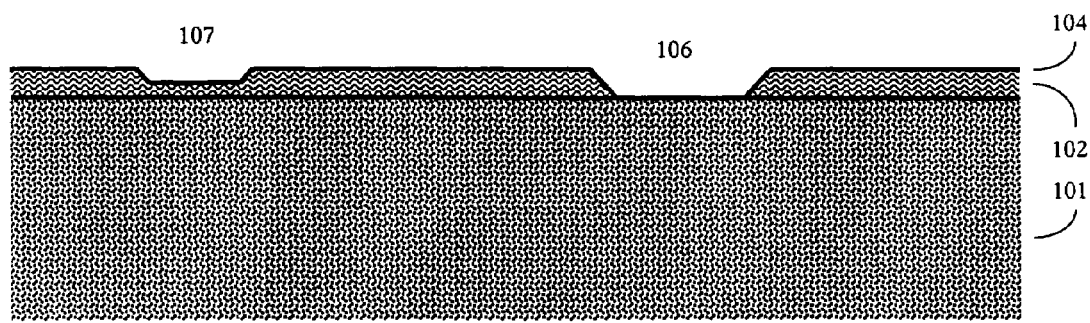
FIG. 4 illustrates a cross section of a surface having a moldable layer thereon and showing the formed topographic pattern in said moldable layer during subsequent etching at the point when the deepest features have been etched through to the underlying substrate.

Following the application of the topographic features into moldable layer, 102, the entire surface is etched. The selectivity of the substrate and the moldable layer material to the etch will generally control the resulting aspect ratio of the resulting topography in substrate, 101. For example, the substrate, 101, could be a silicon wafer having a grown oxide layer that is thicker than the deepest feature in the end resulting topography and the moldable layer, 102, could be a spun on polymer such as PMMA. An anisotropic reactive ion etch (RIE) can be utilized that will, for example, etch the oxide substrate, 101, at a faster rate than the PMMA layer, 102. As pictured in FIG. 4, when this etch is performed, the deepest features, 106, will be the first to be etched all the way through to the substrate's surface while the shallower features, 107, will still have a way to go.

Figure 5:
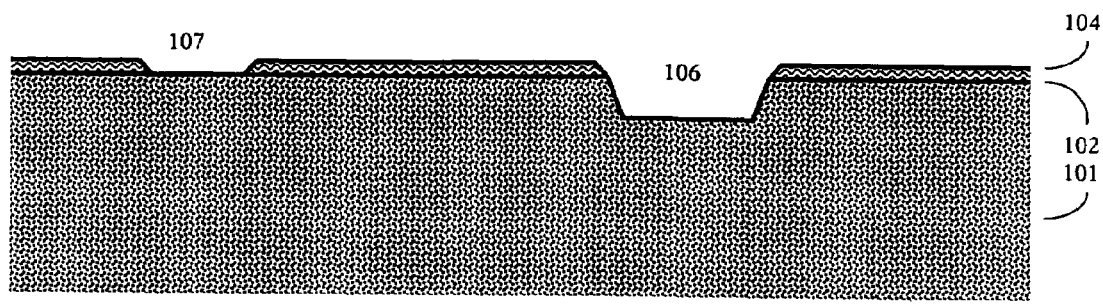
FIG. 5 illustrates a cross section of a surface having a moldable layer thereon and showing the formed topographic pattern in said moldable layer during subsequent etching at the point when a shallower feature has been etched through to the underlying substrate.
Figure 6:
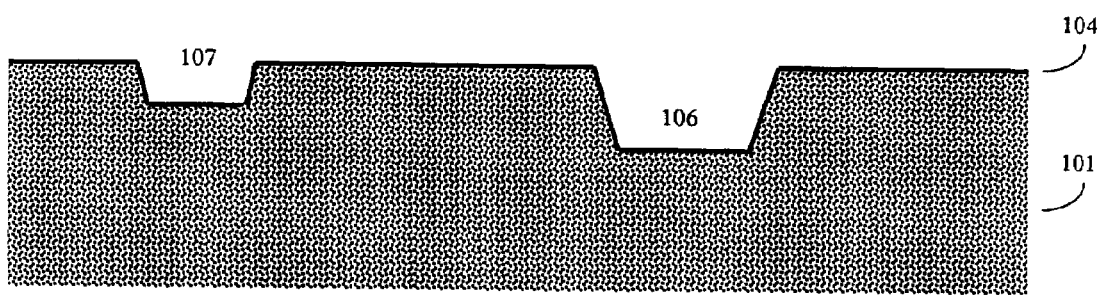
FIG. 6 illustrates a cross section of a surface having a moldable layer thereon and showing the formed topographic pattern in said moldable layer during subsequent etching at the point when the moldable layer thereon has been completely etched through to the underlying substrate.

Referring now to FIG. 5, once a feature has been etched all the way through moldable layer, 102, the substrate, 101, where now exposed in these deepest features, may be etched at a differing rate as a function of the selectivity of the etch chemistry. In the example of PMMA on silicon dioxide, the oxide will be etched faster than the PMMA in many well known RIE etch chemistries. As a result, the aspect ratio will be scaled by the ratio of the etch selectivities and the difference of the moldable layer thickness at the different depth features. Comparing the deepest and the shallowest depth features, by the time the shallow feature is etched all the way through the moldable layer to the substrate, the deep feature will already have etched into the substrate to a depth equal to the difference between the two thicknesses multiplied by the selectivity ratio.

For example, assume an etch that yields a selectivity ratio of 3:1 of oxide over PMMA (that is to say that the oxide etches at a multiple, M, times faster than PMMA, such that M=3), that the thickness of the molded layer under a shallow feature, 107, is $\Delta s$, and that the thickness of the molded layer under a deepest feature, 106, is $\Delta d$. Further define the difference between the thicknesses of the molded layer under a shallow feature and under a deepest feature to be $\Delta T$ where $\Delta T = \Delta s - \Delta d$. When the shallow feature depth just reaches the substrate surface, as shown in FIG. 5, the depth of the deepest feature into the oxide will be $M \times \Delta T$. At this point, there will still be a remaining thickness, $\Delta p$, remaining of the moldable layer remaining on the surface at all locations other than where a feature of the topography exists, and the deepest and shallowest features will continue to etch deeper at generally the same rate (allowing for etch loading effects). The etch is continued until all the remaining moldable layer is etched away. If the original greatest thickness of the moldable layer after molding (other than over the features of the topography) is denoted as "P", then it can be seen that $P = \Delta s + \Delta p = \Delta d + \Delta T + \Delta p$. At the end of etching, the depth of the shallowest feature will be approximately $M \times \Delta p$ and the depth of the deepest feature will be approximately $M \times (\Delta T + \Delta p)$. If the etch is terminated before all of the moldable layer is etched away, $\Delta p$ in these two equations would correspond to the portion of the remaining moldable layer that was etched.

The sidewall angles of features formed into a substrate according to the present invention will by necessity be steeper than what was molded in the moldable layer when the aspect ratio is increased. This, by simple geometry, comes about because the feature widths remain generally the same whereas the depths are scaled upwards. This outcome can only be accommodated by steeper sidewalls. Conversely, if the aspect ratio is made to shrink by reversing the etch selectivity to the substrate and moldable layer, the sidewalls would become more opened. If the etch selectivity is closely matched, the sidewall angle would be generally unchanged. A variation on the present invention, accordingly, would be to select a moldable layer, a substrate, and an etch chemistry that would yield higher or lower aspect ratios and steeper or more open sidewall angles. However, as is known to those skilled in the art, careful selection of the etch chemistry can provide some control of the sidewall angle by causing some undercutting of the moldable layer.

Another variation on the present invention would be to use other etching techniques to transfer the topography from the moldable material into the substrate. These would include, but not be limited to, wet chemical etching and ion milling. Further variations would include applying the moldable layer to a substrate consisting of layers of materials such that further processing could be performed following the transfer of the topography to the substrate—this latter variation may find application in the processing of MEMS devices where a buried layer or layers may be used to release an upper structure formed by the topography.

Figure 7:
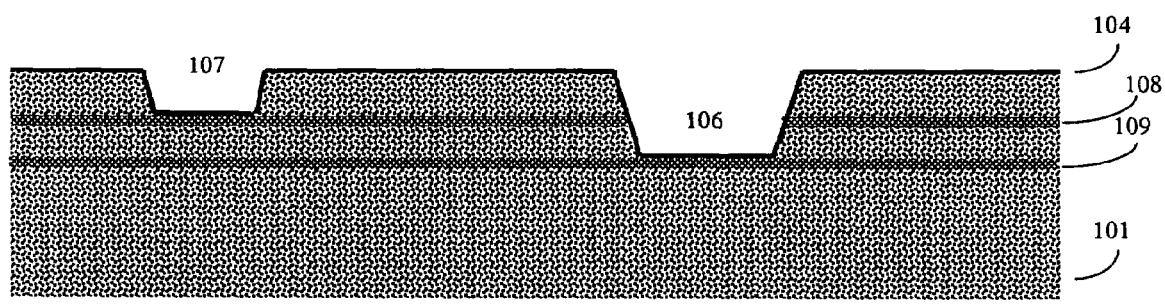
FIG. 7 illustrates a cross section of a surface having a moldable layer thereon and showing the formed topographic pattern in said moldable layer during subsequent etching at the point when the moldable layer thereon has been completely etched through to the underlying substrate utilizing buried etch stops.

Another variation on the present invention would be to bury layers of etch stopping materials, as is well known to those skilled in the art, such that as each feature in the initial pattern reached its desired depth, the etch resistant layer would be reached and thereby better control the depth to which a given feature would be etched as a function of the exact depth of that buried layer. For example, as shown in FIG. 7, Buried layer, 108, would first be reached during the pattern transferring etch and slow or stop the etch. A second etch chemistry would then be used to etch through layer, 108, at feature 106. The first etch would then be continued until layer, 108, is reached at feature, 107, and layer, 109, is reached at feature, 106. The result is that feature 107, will be etched fairly closely to the depth determined by the depth of layer, 108, and feature 106, will be etched fairly closely to the depth determined by the depth of layer, 109. One could also alternatively use gray-scale lithography to form the initial pattern to be transferred into the substrate.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

I claim:

1. A method for transferring a topography into a substrate from a layer of material on a surface of the substrate comprising the steps of:
   a. applying said layer of material to the surface of said substrate,
   b. pressing a mold featuring a topography into the layer of material, and
   c. etching to transfer the topography into the substrate, wherein etch rates of said layer of material and said substrate are different and a ratio of the difference in etch rates controls aspect-ratio scaling of the topography etched into said substrate.

2. The method of claim 1 wherein the layer of material has a slower rate of etching than the substrate.

3. A method for transferring a topography from a layer of material into a substrate comprising the steps of:
   a. applying the layer of material to a surface of the substrate,
   b. patterning a topography into the layer of material,
   c. defining a scaling ratio of a depth of the topography of the layer of material versus a desired depth of corresponding features in the substrate,
   d. selecting an etch chemistry, based on a selectivity of the substrate with respect to the etch chemistry and a selectivity of the layer of material with respect to the etch chemistry, consistent with the scaling ratio, and
   e. using the etch chemistry to transfer the topography into the substrate.

4. The method of claim 3 wherein the topography is patterned using gray-scale lithography.

5. The method of claim 3 wherein the topography is applied using molding.

6. The method of claim 3 wherein the topography is applied by imprinting.

7. The method of claim 3 wherein the depth of a feature of the topography patterned into the layer of material is less than a thickness of the layer of material.

* * * * *